United States Patent

King

(10) Patent No.: US 6,559,642 B2
(45) Date of Patent: May 6, 2003

(54) CALIBRATION METHOD FOR USE WITH SENSITIVITY ENCODING MRI ACQUISITION

(75) Inventor: Kevin F. King, New Berlin, WI (US)

(73) Assignee: GE Medical Systems Global Technology Company, LLC, Waukesha, WI (US)

(*) Notice: Subject to any disclaimer, the term of this patent is extended or adjusted under 35 U.S.C. 154(b) by 0 days.

(21) Appl. No.: 09/851,775

(22) Filed: May 9, 2001

(65) Prior Publication Data

US 2002/0171422 A1 Nov. 21, 2002

(51) Int. Cl.[7] ................................................. G01V 3/00
(52) U.S. Cl. ......................... 324/307; 324/309; 324/306
(58) Field of Search ................................. 324/312, 309, 324/307, 306, 316

(56) References Cited

U.S. PATENT DOCUMENTS

| | | | | |
|---|---|---|---|---|
| 4,812,753 A | * | 3/1989 | Fuderer et al. ............. | 324/307 |
| 5,587,656 A | * | 12/1996 | Van Heels-Bergen et al. ... | 324/307 |
| 5,659,629 A | * | 8/1997 | Cline ......................... | 382/131 |
| 5,759,152 A | * | 6/1998 | Felmlee et al. ............. | 600/410 |
| 5,910,728 A | * | 6/1999 | Sodickson ................... | 324/309 |
| 6,215,911 B1 | * | 4/2001 | Goertler et al. ............. | 382/264 |
| 6,289,232 B1 | * | 9/2001 | Jakob et al. ................ | 600/410 |
| 6,326,786 B1 | * | 12/2001 | Pruessmann et al. ....... | 324/312 |
| 6,366,092 B1 | * | 4/2002 | Ehnholm et al. ........... | 324/309 |
| 6,380,741 B1 | * | 4/2002 | Hajnal et al. .............. | 324/318 |
| 6,483,308 B1 | * | 11/2002 | Ma et al. .................... | 324/312 |

FOREIGN PATENT DOCUMENTS

IL WO 01/69277 A2 * 9/2001

OTHER PUBLICATIONS

Pruessmann, Klaas P.; "Sense: Sensitivity Encoding for Fast MRI" Magnetic Resonance in Medicine, vol. 42; p. 952–962; 1999.*

* cited by examiner

Primary Examiner—Edward Lefkowitz
Assistant Examiner—Dixomara Vargas
(74) Attorney, Agent, or Firm—Quarles & Brady, LLP; Carl Horton

(57) ABSTRACT

Calibration data is acquired during a prescan in an MRI system from each local coil in a coil array. The calibration data is used to calculate a sensitivity matrix S which is employed in a SENSE technique to reconstruct an MR image acquired with the same local coils.

13 Claims, 3 Drawing Sheets

CALIBRATION METHOD FOR USE WITH SENSITIVITY ENCODING MRI ACQUISITION

BACKGROUND OF THE INVENTION

The field of the invention is nuclear magnetic resonance imaging methods and systems. More particularly, the invention relates to methods for acquiring magnetic resonance imaging ("MRI") data using a sensitivity encoding ("SENSE") technique.

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x–y plane and which is near the Larmor frequency, the net aligned moment, $M_z$, may be rotated, or "tipped", into the x–y plane to produce a net transverse magnetic moment $M_t$. A signal is emitted by the excited spins after the excitation signal $B_1$ is terminated, this signal may be received and processed to form an image.

When utilizing these signals to produce images, magnetic field gradients ($G_x$, $G_y$ and $G_z$) are employed. Typically, the region to be imaged is scanned by a sequence of measurement cycles in which these gradients vary according to the particular localization method being used. The resulting set of received NMR signals are digitized and processed to reconstruct the image using one of many well known reconstruction techniques.

The present invention will be described with reference to a variant of the well known Fourier transform (FT) imaging technique, which is frequently referred to as "spin-warp". The spin-warp technique is discussed in an article entitled "Spin-Warp NMR Imaging and Applications to Human Whole-Body Imaging" by W. A. Edelstein et al., *Physics in Medicine and Biology*, Vol. 25, pp. 751–756 (1980). It employs a variable amplitude phase encoding magnetic field gradient pulse prior to the acquisition of NMR spin-echo signals to phase encode spatial information in the direction of this gradient. In a two-dimensional implementation (2DFT), for example, spatial information is encoded in one direction by applying a phase encoding gradient ($G_y$) along that direction, and then a spin-echo signal is acquired in the presence of a readout magnetic field gradient ($G_x$) in a direction orthogonal to the phase encoding direction. The readout gradient present during the spin-echo acquisition encodes spatial information in the orthogonal direction. In a typical 2DFT image acquisition, a series of pulse sequences is performed in which the magnitude of the phase encoding gradient pulse $G_y$ in the pulse sequence is incremented ($\Delta G_y$). The resulting series of views that is acquired during the scan form an NMR image data set from which an image can be reconstructed. The acquisition of each phase encoded view requires a finite amount of time, and the more views that are required to obtain an image of the prescribed field of view and spatial resolution, the longer the total scan time.

Reducing scan time is a very important objective in MRI. In addition to improved patient comfort, shorter scan times free up the imaging system for more patients and reduces image artifacts caused by patient motion. SENSE (SENSitivity Encoding) is a technique described by K. P. Pruessmann, et al., "SENSE: Sensitivity Encoding for Fast MRI", *J. Magn. Reson.* 42, 952–962 (1999), which reduces MRI data acquisition time by using multiple local coils. The idea is to reduce acquisition time by increasing the step size ($\Delta G_y$) between phase encoding views, or equivalently, by reducing the field of view. In either case, the total number of views is reduced with a consequent reduction in scan time. If the object extends outside the reduced field of view, however, aliasing or wrap-around occurs in the phase encoding direction. The SENSE technique removes this aliasing by using knowledge of the surface coil receive field (also called sensitivities) to find the unaliased spin distribution.

For simplicity, one can consider the image intensity variation only in the phase encoding direction, which may be, for example, the y direction. N local coils with B1 receive field sensitivities $S_j(y)$ where $j=0, 1, \ldots N-1$ are used to acquire the NMR data. The reconstructed image intensity for each local coil is weighted by its receive field. If the reconstructed image for coil j is $I_j(y)$, and the ideal proton density distribution, including T1 and T2 weighting factors, is $M(y)$, then $$I_j(y) = S_j(y) M(y) \tag{1}$$

Aliasing or replication occurs in an MR image in the phase encode direction. The replication distance is the same as the field of view. If the field of view D is chosen such that the subject is completely contained within this field of view, the replicates of the subject do not overlap and no artifact results in the reconstructed image. If the field of view is reduced in the y direction by a factor of L, the scan time is also correspondingly reduced by a factor of L. However, now the reconstructed image is aliased or replicated in the y direction at multiples of $\Delta y = D/L$ and aliasing replicates now overlap with resulting loss of diagnostic utility. Mathematically, the image intensity is now $$I_j(y) = S_j(y)M(y) + S_j(y+\Delta y)M(y+\Delta y) + \ldots + S_j(y+(L-1)\Delta y)M(y+(L-1)\Delta y), \tag{2}$$

for $0 \leq y \leq \Delta y$. If the local coil sensitivities $S_j(y)$ are known, and if $N \geq L$, the proton distribution $M(y)$ can be obtained by solving the resulting N equations. In matrix form equation (2) can be written $$I = SM, \tag{3}$$

where:

$$I = \begin{bmatrix} I_0(y) \\ I_1(y) \\ \vdots \\ I_{N-1}(y) \end{bmatrix}, \tag{4}$$

$$M = \begin{bmatrix} M(y) \\ M(y+\Delta y) \\ \vdots \\ M(y+(L-1)\Delta y) \end{bmatrix}, \tag{5}$$

and $$S = \begin{bmatrix} S_0(y) & S_0(y+\Delta y) & \ldots & S_0(y+(L-1)\Delta y) \\ S_1(y) & S_1(y+\Delta y) & \ldots & S_1(y+(L-1)\Delta y) \\ \vdots & & & \\ S_{N-1}(y) & S_{N-1}(y+\Delta y) & \ldots & S_{N-1}(y+(L-1)\Delta y) \end{bmatrix}. \tag{6}$$

Note that I and M are N×1 and L×1 dimensional matrices, respectively, while S has dimensions N×L. The solution of equation (3) is efficiently determined using the pseudoinverse of S. Denoting the complex conjugate transpose of S as S* then $$M = (S^*S)^{-1} S^* I \quad (7)$$

Typically, the coil sensitivity values $S_j(y)$ are obtained by performing two calibration scans. The calibration scans are performed with the subject of the scan in place and throughout the full prescribed field of view. Calibration data from one scan is acquired with the body RF coil which has a substantially homogeneous receive field, and data from the second calibration scan is acquired using each of the N local coils. The B1 field sensitivity of each local coil is obtained by taking the ratio of the complex calibration images acquired with the body coil and each of the surface coils. For example, if $$I_j^{cal}(y) \text{ and } I_{body}^{cal}(y)$$

are the respective full field of view calibration images obtained with surface coil j and the calibration image acquired with the body coil, the sensitivity of the surface coil j is estimated as $$S_j(y) = \frac{I_j^{cal}(y)}{I_{body}^{cal}(y)}. \quad (8)$$

Note that the complex magnetization term M(y) drops out of the ratio in equation (8) if the body coil and the surface coil scans are performed using the same scan prescription. In this case, the reconstructed images have the proton distribution weighted by the body coil B1 field which is normally very homogeneous over the field of view.

The calibration procedure is performed while the subject is in place and the time required to obtain the calibration data is an offset against the time gained by using the SENSE technique. Because the reception fields must be estimated at each imaging plane and throughout the prescribed field of view, many calibration scans are required to acquire the necessary data for the above equations. Various methods of reducing the calibration time are known to those skilled in the art. For example, calibration time can be reduced by reducing spatial resolution, thus requiring fewer phase encoding steps during the calibration. As another example, instead of measuring the sensitivity at each desired imaging plane, the sensitivity can be measured at a small number of fixed, widely separate planes, and interpolation may be used to estimate the sensitivity at the desired planes. The problem is that such obvious methods compromise the accuracy of the sensitivity matrix S in equation (6) if carried too far. One problem to be solved therefore, is how to reduce the calibration time without compromising the accuracy of the sensitivity matrix S.

Another difficulty with the current method for estimating the coil sensitivity matrix S is corruption of the calibration data due to undesirable coupling between the body RF coil and the local coils. It is impractical to remove the local coils from the subject during acquisition of the calibration data with the body RF coil, and the mutual inductance therebetween often couples undesirable signals from the local coils into the body RF coil data. Extra ordinary measures must be taken to reduce this coupling so that accurate body RF coil calibration data can be acquired to solve equation (8).

One solution to the problems associated with the acquisition of body coil calibration data is to eliminate the need for such data. Such a solution is disclosed by J. Wang et al., "A SMASH/SENSE Related Method Using Ratios of Array Coil Profiles", *Proc. Of The 7th ISMRM*, Philadelphia, Pa. 1648 (1999), in which the body coil calibration scans are eliminated. Instead of the sensitivity defined by the ratio of surface coil to body coil intensity, a new reduced sensitivity is defined consisting of the ratios of the various local coil intensities. The resulting image after SENSE unwrapping is then weighted by the various local coil sensitivities. A disadvantage of this method is increased reconstruction time. Since SENSE reconstruction is already computationally intensive, this is a major drawback.

SUMMARY OF THE INVENTION

The present invention is a method for estimating the coil sensitivity matrix S for use in a sensitivity encoded MRI scan. More particularly, the sensitivity S for a coil j in an array of N coils is determined by acquiring calibration data with all N coils, reconstructing calibration images $I^{CAL}$ for each of the N coils; and producing a sensitivity image $S_j$ for each local coil j by calculating the ratio of the calibration image for the local coil j and the sum of all N local coil calibration images. The sensitivity matrix S is formed by combining the local coil sensitivity images $S_j$. There is no need to acquire body coil calibration data and the resulting sensitivity matrix S can be employed in the SENSE reconstruction method.

DESCRIPTION OF THE PREFERRED EMBODIMENT

Figure 1:
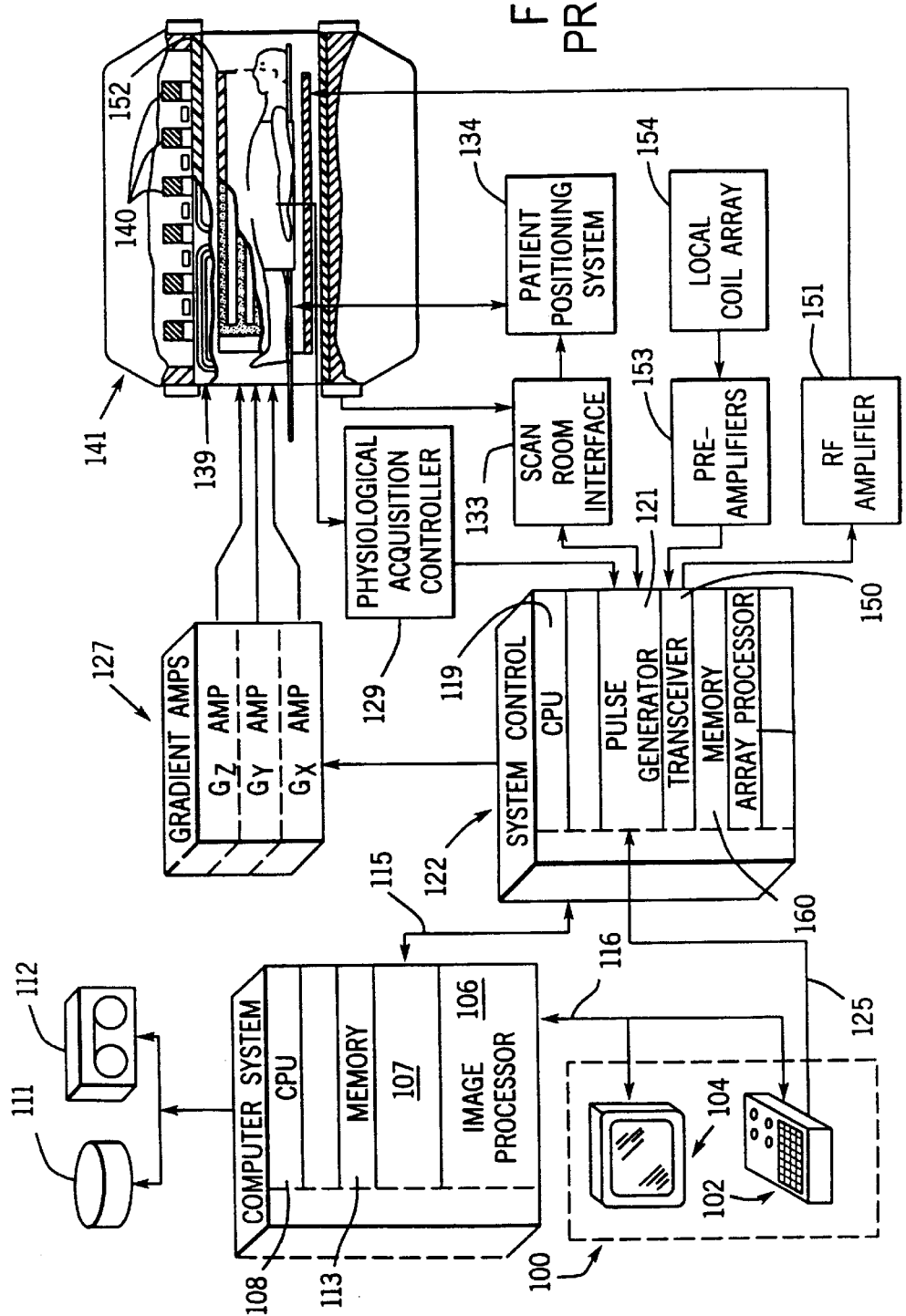
FIG. 1 is a block diagram of an MRI system which employs the present invention.

Referring first to FIG. 1, there is shown the major components of a preferred MRI system which incorporates the present invention. The operation of the system is controlled from an operator console 100 which includes a keyboard and control panel 102 and a display 104. The console 100 communicates through a link 116 with a separate computer system 107 that enables an operator to control the production and display of images on the screen 104. The computer system 107 includes a number of modules which communicate with each other through a backplane. These include an image processor module 106, a CPU module 108 and a memory module 113, known in the art as a frame buffer for storing image data arrays. The computer system 107 is linked to a disk storage 111 and a tape drive 112 for storage of image data and programs, and it communicates with a separate system control 122 through a high speed serial link 115.

The system control 122 includes a set of modules connected together by a backplane. These include a CPU module 119 and a pulse generator module 121 which connects to the operator console 100 through a serial link 125. It is through this link 125 that the system control 122 receives commands from the operator which indicate the scan sequence that is to be performed. The pulse generator module 121 operates the system components to carry out the desired scan sequence. It produces data which indicates the timing, strength and shape of the RF pulses which are to be produced, and the timing of and length of the data acquisition window. The pulse generator module 121 connects to a set of gradient amplifiers 127, to indicate the timing and shape of the gradient pulses to be produced during the scan. The pulse generator module 121 also receives patient data from a physiological acquisition controller 129 that receives signals from a number of different sensors connected to the patient, such as ECG signals from electrodes or respiratory signals from a bellows. And finally, the pulse generator module 121 connects to a scan room interface circuit 133 which receives signals from various sensors associated with the condition of the patient and the magnet system. It is also through the scan room interface circuit 133 that a patient positioning system 134 receives commands to move the patient to the desired position for the scan.

The gradient waveforms produced by the pulse generator module 121 are applied to a gradient amplifier system 127 comprised of $G_x$, $G_y$ and $G_z$ amplifiers. Each gradient amplifier excites a corresponding gradient coil in an assembly generally designated 139 to produce the magnetic field gradients used for position encoding acquired signals. The gradient coil assembly 139 forms part of a magnet assembly 141 which includes a polarizing magnet 140 and a whole-body RF coil 152.

A transceiver module 150 in the system control 122 produces pulses which are amplified by an RF amplifier 151 and coupled to the RF coil 152. The resulting signals radiated by the excited spins in the patient may be sensed by the same RF coil 152, but in the preferred embodiment a local coil array indicated at 154 is employed. The local coil array 154 is positioned around the patient anatomy to be imaged and it includes four separate coil elements (shown in FIG. 2) which receive the NMR signals that are produced during the scan. These NMR signals are separately amplified by pre-amplifiers 153 and applied to the inputs of four separate receivers in the transceiver module 150. The amplified NMR signals are demodulated, filtered, and digitized in the receiver sections of the transceiver 150 to produce four separate k-space data sets.

Figure 2:
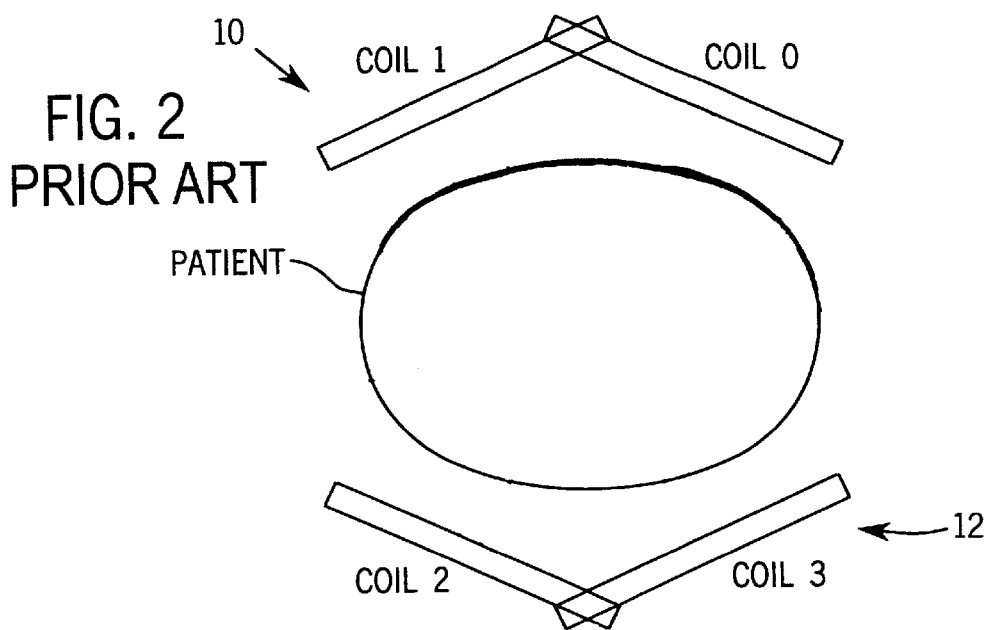
FIG. 2 is a schematic representation of a patient in the MRI system of FIG. 1 surrounded by an array of four local coils.

The local coil array 154 is similar to that disclosed in U.S. Pat. No. 4,825,162. Referring to FIG. 2, each multi-coil set consists of two flexible paddles 10 and 12, each with two surface coil elements fabricated with etched copper on a flexible plastic substrate, for a total of four coil elements. Each coil element is a rectangular loop, approximately 12×25 cm and adjacent elements are overlapped to minimize mutual inductance. The elements are tuned using capacitors distributed around each element, and interface circuitry is added to permit detuning of the element during RF transmission. The coils are positioned anterior and posterior to the imaging volume as depicted in FIG. 2. It should be apparent to those skilled in the art that the present invention is not limited to any particular local coil array and that many alternative local coils are commercially available and suitable for this purpose.

The NMR signals picked up by the coil array 154 are digitized by the transceiver module 150 and transferred to a memory module 160 in the system control 122. When the image scan is completed the four resulting k-space data sets are processed as will be described in more detail below. This data is conveyed through the serial link 115 to the computer system 107 where it is stored in the disk memory 111. In response to commands received from the operator console 100, this data may be archived on the tape drive 112, or it may be further processed by the image processor 106 and conveyed to the operator console 100 and presented on the display 104.

The above-described MRI system may be used to perform many prescribed scans on a patient positioned in the bore of the magnet 141. Such prescriptions identify the type of imaging pulse sequence to be used (e.g., GRE, FSE, EPI, etc.) and the particular scan parameters for the selected pulse sequence (e.g. TR, TE, flip-angle). The present invention may be used with any such prescribed scan to enable it to be performed faster. Typically, the faster scan is achieved by reducing the field of view in one or more phase encoding directions such that fewer phase encoding views are required to sample all of k-space.

Figure 3:
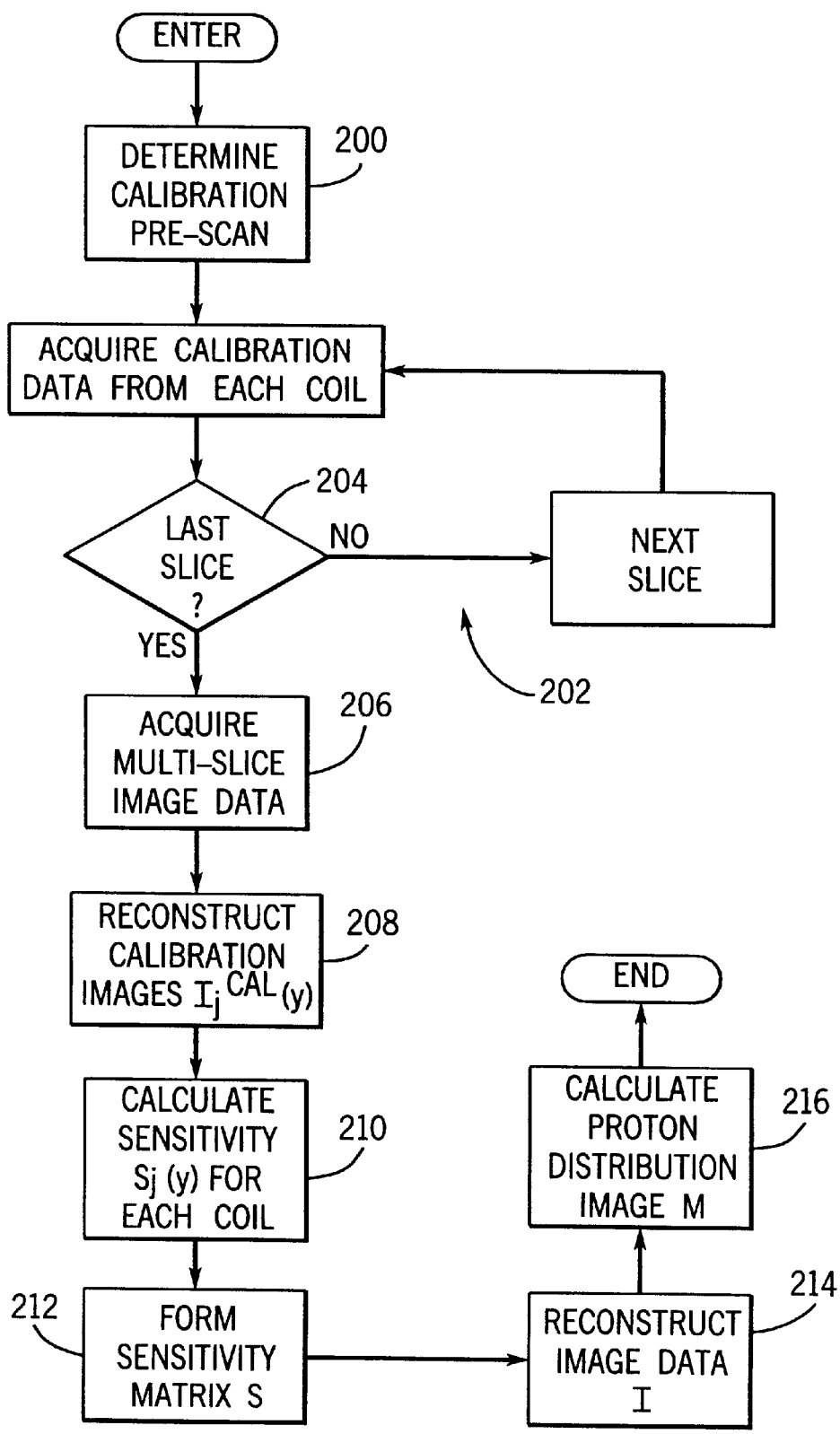
FIG. 3 is a flow chart illustrating the steps performed by the MRI system of FIG. 1 to practice the preferred embodiment of the invention.

Referring particularly to FIG. 3, the scan parameters which define the imaging volume are input by the operator along with other scan parameters. These are employed to determine the parameters of a calibration pre-scan as indicated at process block 200. Although many different imaging pulse sequences may be used to perform the calibration pre-scan, in the preferred embodiment a fast, 2D gradient-recalled echo pulse sequence is employed because of its speed and other well known qualities. A flip-angle of 45°, a TR of 100 msec and a TE of 6 msec is prescribed for the calibration pre-scan. The prescribed imaging volume is covered using contiguous slices from 5 to 10 mm in thickness and with 128×128 voxels in each slice. These parameters are lower in resolution than the typical imaging prescription, but the resolution is sufficient to produce a quality sensitivity matrix S while limiting the calibration pre-scan time.

A loop is then entered in which each slice in the prescribed calibration pre-scan is acquired as indicated at 202. This is done with the patient positioned in the MRI system. When the last calibration scan has been acquired, as indicated at decision block 204, the prescribed image scan is performed as indicated at process block 206. As indicated above, any imaging pulse sequence may be used, but as with the calibration pre-scan, RF excitation is performed using the RF body coil 152 and NMR signal acquisition is performed using the local coil array 154.

The SENSE technique enables the field of view, or number of phase encodings to be reduced along a selected phase encoding axis. This selected phase encoding axis may be along any axis. In the following discussion this gradient axis is indicated as the y-axis, however, it should be understood, that any phase encoding axis is possible and the invention is not limited to a specific gradient axis direction.

Referring still to FIG. 3, the 2D image data acquisition during the calibration pre-scan is used to reconstruct a set of calibration images $I_j^{cal}(y)$ as indicated at process block 208. This reconstruction is a two-dimensional, complex Fourier transformation which yields a 128×128 array of complex pixel intensity values for each slice acquired by each local coil. The sensitivity $S_j(y)$ for each local coil j is then calculated at process block 210. in one preferred embodiment the local coil sensitivity $S_j(y)$ is calculated as follows:

$$S_j(y) = \frac{I_j^{cal}(y)}{\sqrt{\sum_{j=0}^{N-1} |I_j^{cal}(y)|^2}}. \tag{9}$$

where N is the number of local coils and $I_j^{cal}(y)$ is a complex image acquired over the full field of view of the imaging volume with surface coil j. One disadvantage of the sensitivity definition in equation (9) is that the complex magnetization of the object M(y) still contains the phase of the object magnetization. The phase information in the reconstructed image will therefore not be correctly represented.

In a second preferred embodiment, the sensitivity $S_j(y)$ is defined as:

$$S_j(y) = \frac{I_j^{cal}(y)}{\sum_{J=0}^{N-1} I_j^{cal}(y)}. \quad (10)$$

The sensitivity definition in equation 10 has the advantage that the complex magnetization completely drops out of the definition, thereby resulting in more accurate phase information in the reconstructed image. A possible disadvantage of this embodiment is less uniform image intensity weighting because of possible partial cancellation of the N complex terms in the denominator of equation (10). Such cancellation is not possible with the sensitivity definition in equation (9) because the N factors in the denominator are positive definite.

Both of these methods for calculating the local coil sensitivity $S_j(y)$ in essence calculate the ratio of the calibration image intensity of the local coil itself and the sum of all the local coil calibration image intensities. The important point is that no calibration image is required from the RF body coil 152.

The next step indicated at process block 212 is to form the sensitivity matrix S. As set forth above in equation (6), the sensitivity matrix S is formed by combining the separate coil sensitivities $S_j(y)$ into a single matrix. In addition, the resolution of the sensitivity matrix S is usually less than the prescribed image resolution, and therefore, the sensitivity has not been measured at each image pixel location. This is rectified by interpolating the lower resolution sensitivity matrix S in order to provide sensitivity values at each image pixel.

As indicated at process block 214, the next step in the method is to reconstruct each 2D slice image produced by each local coil. This is accomplished by performing a 2D Fourier transformation on the acquired image data and organizing the complex intensity values into an array I as expressed in equation (4). The proton distribution image M is then calculated at process block 216 using the above equation (7):

$$M = (S^*S)^{-1}S^*I$$

where S is the complex conjugate of the sensitivity matrix S. Typically a magnitude image is calculated from the I and Q values at each pixel location in the resulting image M.

What is claimed is:

1. A method for producing an image of a subject with a magnetic resonance imaging (MRI) system, the steps comprising:
    a) performing a pulse sequence with the MRI system to acquire calibration data with each of N local coils positioned near the subject;
    b) performing a prescribed imaging pulse sequence with the MRI system to acquire image data with each of the N local coils;
    c) reconstructing calibration images with the calibration data;
    d) for each local coil, calculate a coil sensitivity image by calculating the ratio of the local coil's calibration image and the sum of all the local coil calibration images;
    e) forming a sensitivity matrix S from the coil sensitivity images;
    f) reconstructing an image I from the acquired image data; and
    g) calculating a proton distribution image M using the sensitivity matrix S and the image I.

2. The method as recited in claim 1 in which step e) is performed by combining each of the coil sensitivity images and interpolating the result to form a sensitivity matrix S having the same resolution as the image I.

3. The method as recited in claim 2 in which step g) is performed using the formula:

$$M = (S^*S)^{-1}S^*I,$$

where S* is the complex conjugate of the sensitivity matrix S.

4. The method as recited in claim 1 in which the pulse sequence used in step a) is different than the prescribed imaging pulse sequence used in step b).

5. The method as recited in claim 4 in which the calibration data acquired in step a) and the image data acquired in step b) are acquired from substantially the same imaging volume in the subject.

6. The method as recited in claim 4 in which the calibration images have a substantially lower spatial resolution than the image I.

7. The method as recited in claim 5 in which the pulse sequence used in step a) is a fast, gradient-recalled echo pulse sequence.

8. The method as recited in claim 1 in which the pulse sequence in step a) includes producing an RF excitation field using an RF body coil on the MRI system.

9. The method as recited in claim 8 in which the imaging pulse sequence in step b) includes producing an RF excitation field using the RF body coil.

10. A method for producing a sensitivity matrix S for a set of N local coils, the steps comprising:
    a) positioning a subject to be imaged in a magnetic resonance imaging (MRI) system;
    b) positioning the set of N local coils near the subject;
    c) acquiring calibration data by performing a pulse sequence with the MRI system and acquiring a calibration image $$I_j^{cal}$$

with each local coil;
    d) for each local coil, calculate a coil sensitivity image $S_j$ by calculating the ratio of the local coil's calibration image and the sum of all the local coil calibration images; and
    e) forming the sensitivity matrix S from the coil sensitivity images.

11. The method as recited in claim 10 in which step e) is performed by combining each of the coil sensitivity images $S_j$, such that $$S = \begin{bmatrix} S_0(y) & S_0(y+\Delta y) \ldots S_0(y+(L-1)\Delta y) \\ S_1(y) & S_1(y+\Delta y) \ldots S_1(y+(L-1)\Delta y) \\ \vdots & \\ S_{N-1}(y) & S_{N-1}(y+\Delta y) \ldots S_{N-1}(y+(L-1)\Delta y) \end{bmatrix}.$$

12. The method as recited in claim 10 in which the pulse sequence used in step c) is a fast, gradient-recalled echo pulse sequence.

13. The method as recited in claim 10 in which the pulse sequence in step c) includes producing an RF excitation field using an RF body coil on the MRI system.

* * * * *